United States Patent

Akagawa

[11] Patent Number: 5,404,273
[45] Date of Patent: Apr. 4, 1995

[54] SEMICONDUCTOR-DEVICE PACKAGE AND SEMICONDUCTOR DEVICE

[75] Inventor: Masatoshi Akagawa, Nagano, Japan

[73] Assignee: Shinko Electric Industries Co., Ltd., Nagano, Japan

[21] Appl. No.: 216,323

[22] Filed: Mar. 23, 1994

[30] Foreign Application Priority Data

Mar. 23, 1993 [JP] Japan .................. 5-063737

[51] Int. Cl.$^6$ .................. H05K 7/20; H01L 23/28
[52] U.S. Cl. .................. 361/707; 361/709; 361/736; 361/749; 174/52.2; 174/52.4; 257/687; 257/693; 257/706; 257/713; 257/796
[58] Field of Search .................. 174/52.2, 52.4, 52.3; 361/704, 707, 709, 711, 718–720, 728, 736, 749; 257/687–688, 700, 706–707, 712–713, 787, 796, 690, 692

[56] References Cited

U.S. PATENT DOCUMENTS

| 4,964,019 | 10/1990 | Belanger, Jr. .................. 174/252 |
| 5,251,100 | 10/1993 | Fujita et al. .................. 361/719 |

FOREIGN PATENT DOCUMENTS

| 0352429 | 1/1990 | European Pat. Off. . |
| 0376062 | 7/1990 | European Pat. Off. . |
| 0476971 | 3/1992 | European Pat. Off. . |
| 0524761 | 1/1993 | European Pat. Off. . |
| 4-96257 | 3/1992 | Japan . |

OTHER PUBLICATIONS

*IBM Technical Disclosure Bulletin*, vol. 31, No. 4, "Tape Automated Bonding/Pin Grid Array Package," Sep. 1988, Armonk, N.Y., pp. 279–280.

Primary Examiner—Bot Ledynh
Attorney, Agent, or Firm—Staas & Halsey

[57] ABSTRACT

A semiconductor-device package includes: a printed circuit board which has a chip-accommodating hole in its center portion and which has external connection terminals formed on its one side and a flexible substrate which has a supporting film having a central hole coaxial with the chip-accommodating hole, a given circuit pattern which is formed on the supporting film and inner leads which project inside the central hole and which have micro patterns, the flexible substrate being bonded on the other side of the circuit pattern of the printed circuit board with electrical conduction between them.

7 Claims, 5 Drawing Sheets

SEMICONDUCTOR-DEVICE PACKAGE AND SEMICONDUCTOR DEVICE

BACKGROUND OF THE INVENTION

1. Field of the Invention

The present invention relates to a semiconductor-device package and a semiconductor device.

2. Description of the Related Art

A TAB (Tab Automated Bonding) tape comprises a heat resistant support film (for example, a polyimide film or the like) and a circuit pattern made of copper foil formed on the support film, the circuit pattern having inner leads projecting inside an element-accommodating hole of the support film and outer leads projecting outside the support film.

A conventional bonding technique using this TAB tape makes it possible to facilitate tests of semiconductor elements (chips) before packaging them, to simultaneously bond a narrow-pitch chip whose pitch width is so narrow that this chip cannot be simultaneously bonded by means of a conventional multi-pin and wire-bonding technique. Furthermore such a TAB tape bonding technique is superior to a wire-bonding technique with regard to its high frequency properties and is suitable to high density packaging. Therefore, such a TAB tape bonding technique is very appropriate to a multi-pin, narrow-pitch and high-speed chip, such as a CPU chip or the like.

However, in such a conventional TAB tape bonding technique, both inner lead bonding and outer lead bonding is required and, as a result, a large number of working man-hours are inevitably required. In addition to this, because of requirements for mounting the package on a substrate, the pitch width between outer leads cannot be made narrow in the same manner as the pitch width between inner leads and, for this reason, the outer leads must project beyond its the support film. Thus, according to such a conventional TAB tape bonding technique, the overall size of a semiconductor device typically becomes larger when a chip is mounted on it, which is contrary to demands of miniaturization.

Furthermore, when such a conventional TAB tape bonding technique is applied to a high-power chip such as a CPU chip or the like, complex and expensive packaging is necessary because adaptation to a heat radiating structure is difficult to achieve.

FIG. 10 shows an example of a heat radiation structure on a conventional semiconductor device.

This conventional semiconductor device has a complex and expensive package structure. As shown in this figure, a circuit pattern for a PGA (Pin Grid Array) type package 10 and a chip 11 is connected through a TAB tape 12 and is sealed by a cap 13. Moreover, by means of soldering or the like, a heat sink 15 is fastened to a support 14 bonded to the chip 11.

SUMMARY OF THE INVENTION

An object of the present invention is to provide a semiconductor-device package and a semiconductor device, capable of solving the above-mentioned problems.

Another object of this invention is to provide a miniature and low-cost semiconductor-device package which has excellent packaging ability and makes it possible to mount a multi-pin and narrow-pitch chip which can not be bonded on the inner lead side of such a package by conventional wire-bonding technique.

A further object of this invention is to provide a semiconductor device which is low-cost and miniature and, in addition to this, which excels in heat radiating ability, packaging ability and electrical properties even when it mounts a multi-pin, narrow-pitch and high-power chip.

In order to accomplish the above-mentioned objects, according to the present invention, there is provided a semiconductor-device package comprising: a printed circuit board having a chip-accommodating hole, respective surfaces and a circuit pattern, one of said surfaces providing with external connection terminals electrically connected to said circuit pattern; a flexible substrate comprising a supporting film having a central hole substantially coaxial with said chip-accommodating hole and a circuit pattern formed on said supporting film, at least a part of said circuit pattern projecting inside said central hole as inner leads having micro patterns; and said flexible substrate being bonded to the other surface of said printed circuit board in such a manner that the circuit pattern of the flexible substrate is electrically connected to the circuit pattern of said printed circuit board.

In another aspect of the present invention, there is provided a semiconductor-device comprising:

(a) a package comprising: a printed circuit board having a chip-accommodating hole, respective surfaces and a circuit pattern, one of said surfaces providing with external connection terminals electrically connected to said circuit pattern; a flexible substrate comprising a supporting film having a central hole substantially coaxial with said chip-accommodating hole and a circuit pattern formed on said supporting film, at least a part of said circuit pattern projecting inside said central hole as inner leads having micro patterns; and said flexible substrate being bonded to the other surface of said printed circuit board in such a manner that the circuit pattern of the flexible substrate is electrically connected to the circuit pattern of said printed circuit board;

(b) a semiconductor chip simultaneously bonded and mounted on said inner leads of said package;

(c) a heat radiating plate attached to said package so as to cover said chip-accommodating hole and to directly or indirectly contact said semiconductor chip to support said chip; and (d) means for sealing said semiconductor chip located in said chip-accommodating hole.

According to a semiconductor-device package of this invention, it is possible to perform bonding by a conventional bonding technique in order to electrically connect said semiconductor-device package and a chip together. Thus, a semiconductor-device package of the present invention is especially suitable for packaging a multi-pin and narrow-pitch chip which cannot be bonded by a conventional wire-bonding technique. Furthermore, the present invention can provide a miniature and low-cost semiconductor-device package which has excellent packaging ability because the semiconductor-device package of the present invention has no outer leads projecting outwardly in contrast to a TAB tape.

Furthermore, according to a semiconductor device of the present invention, it becomes possible to provide a semiconductor device which excels in heat radiating ability, high-density packaging ability and electrical properties even when it mounts a multi-pin, narrow-pitch and high-power chip.

DESCRIPTION OF THE PREFERRED EMBODIMENTS

In order that the present invention can be readily carried into effect, its preferred embodiments will now be described with reference to the accompanying drawings.

Figure 1:
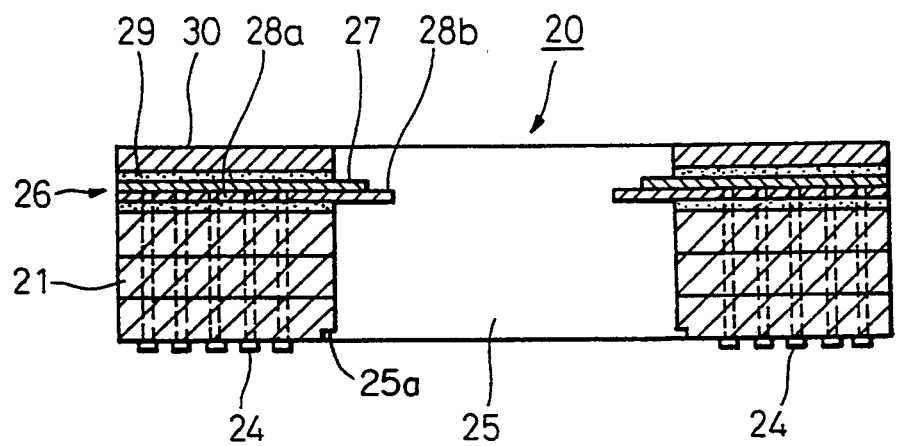
FIG. 1 is a vertical cross-sectional view of an embodiment of a semiconductor-device package according to the present invention.
Figure 2:
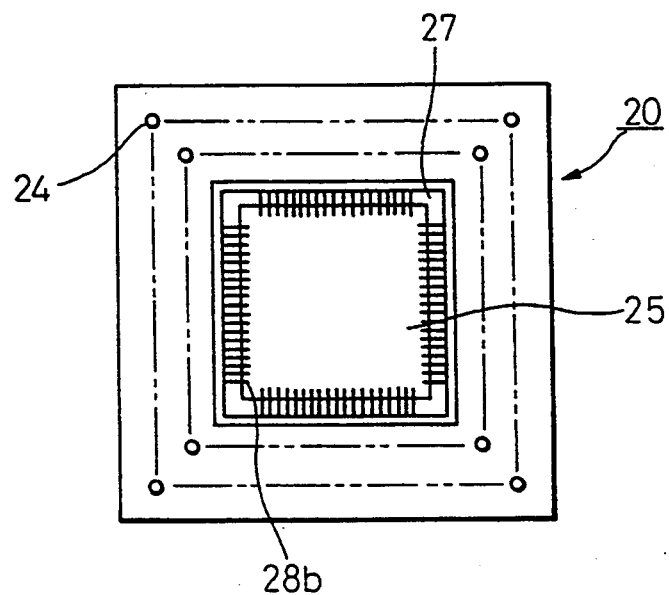
FIG. 2 is a bottom view of the example of FIG. 1.

FIG. 1 is a cross-sectional view of an embodiment of a semiconductor-device package 20 and FIG. 2 is a bottom view of the same. A multi-layer printed circuit board is indicated at 21. The top pattern and the bottom pattern of this printed circuit board are electrically coupled together through conducting portions, such as through-hole plating or the like. This printed circuit board has multiple layers which include a signal circuit pattern, as well as a ground circuit pattern, a power-supply circuit pattern and the like which are separated from the signal layer in view of these electrical properties. These circuit patterns are formed inside the printed circuit board.

External connection bumps or terminals 24 are formed on the bottom surface of the printed circuit board 21. These bumps 24 may be lead pins, solderable pads or conductive adhesive.

A chip-accommodating hole 25 is formed in the center portion of the printed circuit board 21.

The printed circuit board 21 is provided on the bottom surface thereof with a dent in a along the periphery of the chip-accommodating hole 25. This dent works as a recess for a cap fitting.

A flexible substrate is indicated at 26. This substrate is fixed on the upper surface of the printed circuit board 21 by means of an adhesive. In the embodiment shown in FIG. 1, by etching a copper foil on the bottom surface of the supporting film 27 (for example, a polyimide film), a circuit pattern 28a on a bottom surface of the supporting film 27 and a pattern of inner leads 28b projecting inside said chip-accommodating hole 25 are formed.

The supporting film 27 is also formed in a frame-like form which has a hole in its center portion. This hole is made so as to have a smaller size than that of the chip-accommodating hole 25. Preferably, a portion of the supporting film 27 projects inside the chip-accommodating hole 25 and supports the base portions of the inner leads 28b which project inside the chip-accommodating hole 25.

As described above, the flexible substrate 26 is fixed on the printed circuit board 29 by means of an adhesive.

In the same way as an electrical connection between the lower and upper patterns in a conventional printed circuit board, a circuit pattern on the upper surface of the printed circuit board 21 and the circuit pattern 28a on the bottom surface of the supporting film 27 are electrically coupled together through a plated film on the inner surface of through-holes.

This plated film is formed by boring holes through the printed circuit board at necessary points and by forming a through-hole plated film on the inner surface of the through-holes. That is to say, the whole structure of a package body 20 is able to be made by means of substantially the same structure and method as those used for a conventional printed circuit board. Furthermore, according to this embodiment, only the inner leads 28b of the circuit pattern on the top layer of the printed circuit board 21 project inside the chip-accommodating hole 25 in the form of TAB tape. This makes the structure of the package 20 different from that of a conventional semiconductor-device package.

It is preferable to bond a spacer 30 made of a material such as a resin containing a glass-filler to the upper side of the supporting film 27 by using an adhesive material. Preferably, this spacer 30 has such a thickness that the upper surface of a semiconductor chip 31 (FIG. 3) can be flush with the upper surface of the spacer 30 when the semiconductor chip 31 is mounted on the inner leads 28b.

Figure 3:
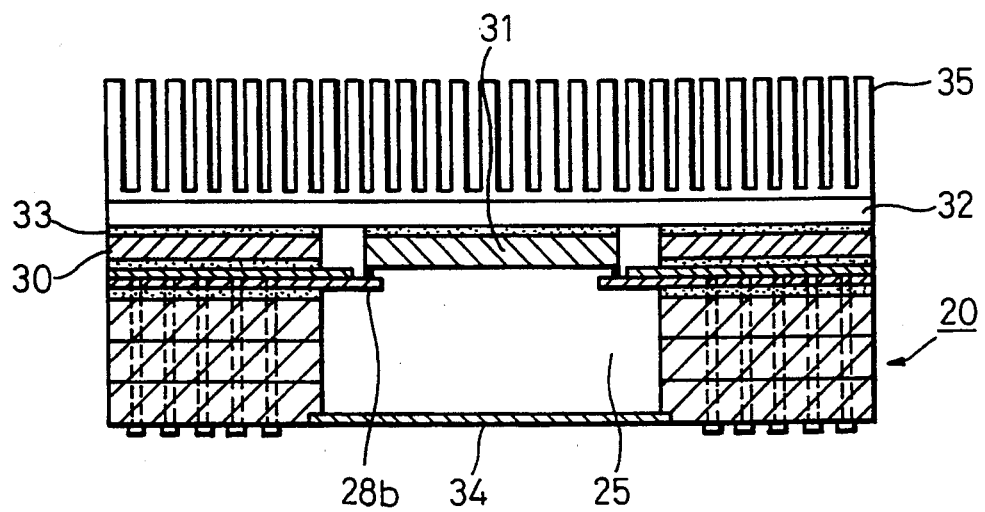
FIG. 3 is a longitudinal sectional view of the example of FIG. 1 which is completed as a semiconductor device.

FIG. 3 shows an embodiment of a semiconductor device in which the semiconductor chip 31 is mounted and sealed on the above-mentioned package 20.

The chip 31 can be mounted on the inner leads 28b by simultaneous bonding. The upper surface of the chip 31 mounted in this manner is almost flush with the upper surface of the spacer 30. The upper side of the chip 31 and the upper side of the spacer 30 are applied with an adhesive 33 and a heat sink 32 is fixed on these surfaces and is laid over the chip-accommodating hole 25.

The heat sink 32 may be made of a metal material such as aluminum, copper-tungsten alloy, copper and the like. A fin member 35 is preferably mounted on the heat sink 32.

Then, after the bottom surface of the chip-accommodating hole 25 is air-tightly sealed by a cap 34, a semiconductor device is completed.

Figure 4:
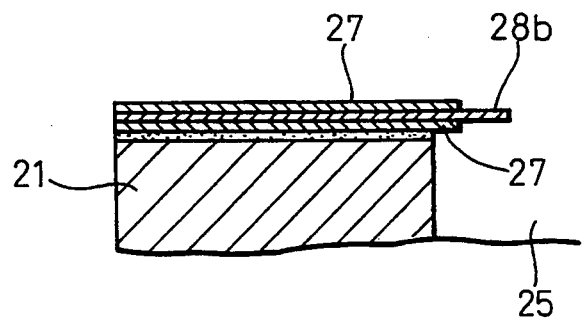
FIG. 4 shows another example of the substrate in the embodiment shown in FIG. 1.

Furthermore, each of the upper and bottom surfaces of the inner leads 28b can be provided with the above-mentioned supporting film 27 (FIG. 4) and, as a result, the inner leads 28b can be supported from their both the upper and bottom surfaces thereof, which reinforces the mechanical strength of the inner leads. In this case, by the formation of through-holes piecing the printed circuit board 21, the electrical coupling between the circuit pattern 28a and the circuit pattern on the upper side of the printed circuit board 21 can be established in the same manner as described above.

Figure 5:
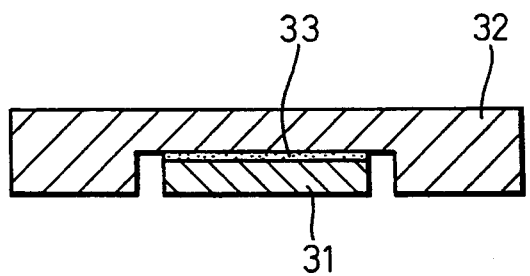
FIG. 5 shows another example of the heat sink in the embodiment shown in FIG. 1.

Furthermore, it is not always necessary to use the spacer 30. When the spacer 30 is not used, it is preferable to use the heat sink 32 having a recess whose depth is equal to the thickness of the chip 31, as shown in FIG. 5.

Figure 6:
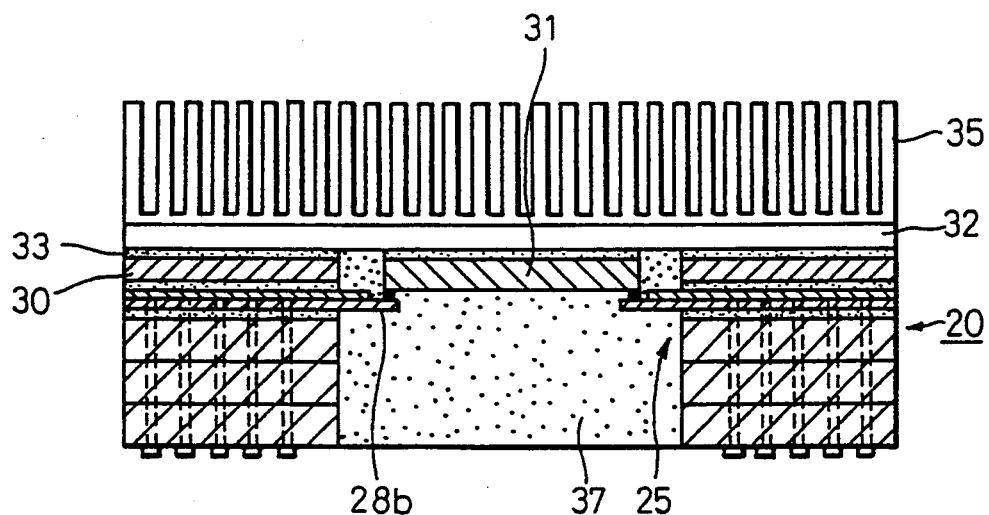
FIG. 6 is a cross-sectional view of another embodiment of a semiconductor-device package of this invention.

FIG. 6 shows another embodiment of a semiconductor-device package of this invention. In this embodiment, the cap 34 is not used to air-tightly seal the bottom surface of the chip-accommodating hole 25, but the chip-accommodating hole 25 is filled with a resin 37 to hermetically seal the chip 31 and the TAB tape.

Figure 7:
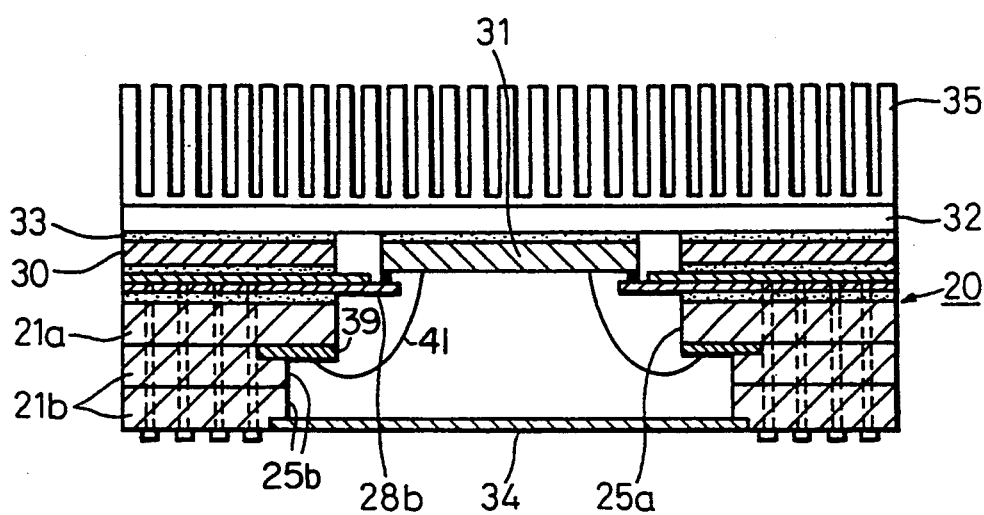
FIG. 7 is a cross-sectional view of another embodiment of a semiconductor-device package of this invention.

In an embodiment shown in FIG. 7, the chip accommodating holes 25b of the printed circuit boards 21b are larger than the chip accommodating holes 25a of the printed circuit boards 21a. Thus, chip 31 is electrically connected to the conductive patterns 39 on the circuit board 21a by bonding wires 41. Such a connection can be done by a conventional wire-bonding process.

Figure 8:
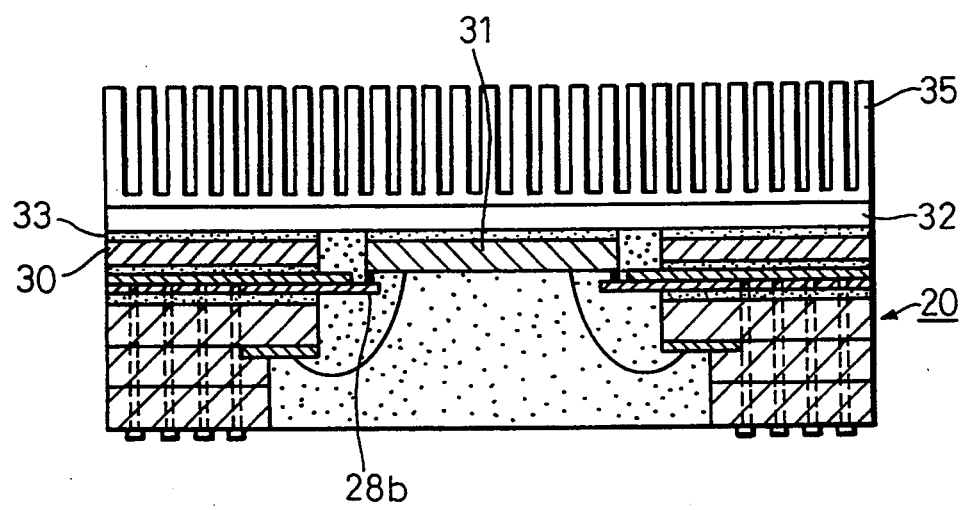
FIG. 8 is a cross-sectional view of another embodiment of a semiconductor-device package of this invention.

FIG. 8 shows another embodiment of a semiconductor-device package which is similar to that of FIG. 7, except that the cap 34 is not used, but the chip-accommodating hole 25a, 25b is filled with a resin 37 in the same manner as the embodiment of FIG. 6.

Figure 9:
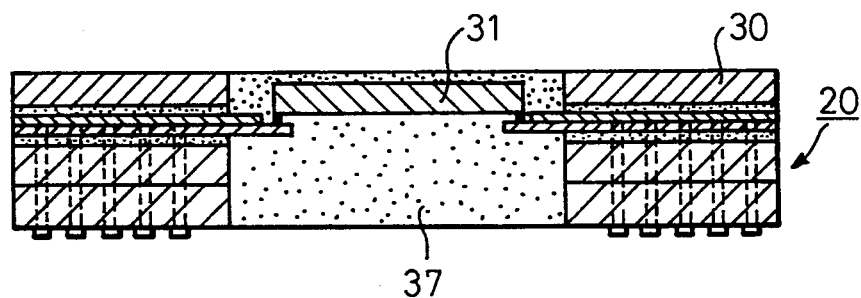
FIG. 9 is a cross-sectional view of an embodiment similar to that of FIG. 6.
Figure 10:
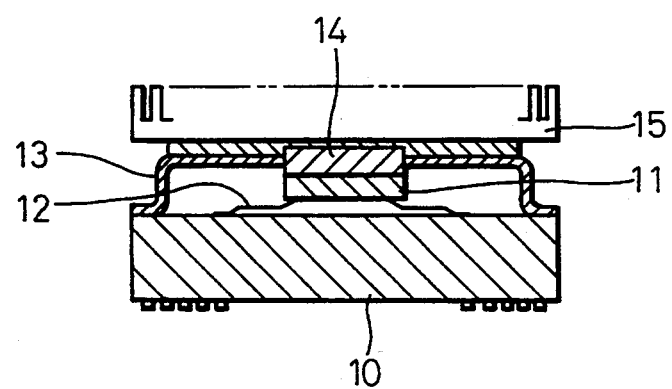
FIG. 10 is a cross-sectional view of a semiconductor device having a conventional heat-radiating structure.

FIG. 9 shows another embodiment of a semiconductor-device package which is similar to that of FIG. 6, except that the heat sink 32 and the fin member 35 are not used. Therefore, the structure and the function of this embodiment are quite the same as the embodiment of FIG. 6 except for the heat radiation means.

According to a semiconductor-device package of this invention, it is possible to bond a semiconductor device package and a chip together by a conventional TAB bonding technique in order to electrically couple the package and the chip together. Thus a semiconductor-device package of the present invention is especially suitable for packaging a multi-pin and narrow-pitch chip which cannot be bonded by a conventional wire-bonding technique. Furthermore, the present invention can provide a miniature and low-cost semiconductor-device package which has excellent packaging ability because the semiconductor-device package of the present invention has no outer leads projecting outward in contrast to a TAB tape.

According to the present invention, it becomes possible to provide a semiconductor-device which excels in heat radiating ability, high-density packaging ability and electrical properties even when it mounts a multi-pin, narrow-pitch, high-speed and high-power chip.

While several preferable embodiments of the present invention have been described above, the present invention is not limited to these embodiments and many modifications and variations can be made without departing from the scope of the invention.

I claim:

1. A semiconductor-device package comprising:
   a printed circuit board having a chip-accommodating hole, respective surfaces and a circuit pattern, one of said surfaces being provided with external connection terminals electrically connected to said circuit pattern;
   a flexible substrate comprising a supporting film having a central hole substantially coaxial with said chip-accommodating hole and a circuit pattern formed on said supporting film, at least a part of said circuit pattern projecting inside said central hole as inner leads having micro patterns; and
   said flexible substrate being bonded to the other surface of said printed circuit board in such a manner that the circuit pattern of the flexible substrate is electrically connected to the circuit pattern of said printed circuit board.

2. A semiconductor-device package as set forth in claim 1, wherein said printed circuit board is a multi-layer printed circuit board.

3. A semiconductor-device comprising:
   a package comprising:
      a printed circuit board having a chip-accommodating hole, respective surfaces and a circuit pattern, one of said surfaces being provided with external connection terminals electrically connected to said circuit pattern;
      a flexible substrate comprising a supporting film having a central hole substantially coaxial with said chip-accommodating hole and a circuit pattern formed on said supporting film, at least a part of said circuit pattern projecting inside said central hole as inner leads having micro patterns; and
      said flexible substrate being bonded to the other surface of said printed circuit board in such a manner that the circuit pattern of the flexible substrate is electrically connected to the circuit pattern of said printed circuit board;
   a semiconductor chip bonded to and mounted on said inner leads of said package;
   a heat radiating plate attached to said package so as to cover said chip-accommodating hole and directly or indirectly contact said semiconductor chip thereby to support said chip; and
   means for sealing said semiconductor chip located in said chip-accommodating hole.

4. A semiconductor-device as set forth in claim 3, wherein said heat radiating plate is attached to said package via a spacer.

5. A semiconductor-device as set forth in claim 3, wherein said sealing means comprises a cap which hermetically closes said chip-accommodating hole in cooperation with said heat radiating plate.

6. A semiconductor-device as set forth in claim 3, wherein said sealing means comprises a molded resin filled in said chip-accommodating hole.

7. A semiconductor device comprising:
   a package comprising:
      a printed circuit board having a chip-accommodating hole, respective surfaces and a circuit pattern, one of said surfaces being provided with external connection terminals electrically connected to said circuit pattern;
      a flexible substrate comprising a supporting film having a central hole substantially coaxial with said chip-accommodating hole and a circuit pattern formed on said supporting film, at least a part of said circuit pattern projecting inside said central hole as inner leads having micro patterns;
      said flexible substrate being bonded to the other surface of said printed circuit board in such a manner that the circuit pattern of the flexible substrate is electrically connected to the circuit pattern of said printed circuit board;
      a semiconductor chip bonded to and mounted on said inner leads of said package; and
      sealing means comprising a molded resin filled in said chip-accommodating hole.

* * * * *

UNITED STATES PATENT AND TRADEMARK OFFICE
CERTIFICATE OF CORRECTION

PATENT NO. : 5,404,273
DATED : April 4, 1995
INVENTOR(S) : AKAGAWA

It is certified that error appears in the above-indentified patent and that said Letters Patent is hereby corrected as shown below:

Col. 1, line 39, after "beyond" delete "its".

Col. 2, line 64, after "outwardly" insert --,--;

Col. 3, line 57, change "dent in a" to --dent 25a--.

Col. 4, line 59, delete "their".

Col. 5, line 13, change "boards" to --board--.

Signed and Sealed this

Twenty-fourth Day of October, 1995

Attest:

BRUCE LEHMAN

Attesting Officer     Commissioner of Patents and Trademarks